US008462506B2

(12) United States Patent
Stoev

(10) Patent No.: US 8,462,506 B2
(45) Date of Patent: Jun. 11, 2013

(54) WATER-COOLED REACTOR

(75) Inventor: Alexander Stoev, Forch (CH)

(73) Assignee: Woodward IDS Switzerland AG, Zurich (CH)

( * ) Notice: Subject to any disclaimer, the term of this patent is extended or adjusted under 35 U.S.C. 154(b) by 166 days.

(21) Appl. No.: 12/994,648

(22) PCT Filed: May 25, 2009

(86) PCT No.: PCT/CH2009/000173
§ 371 (c)(1),
(2), (4) Date: Nov. 24, 2010

(87) PCT Pub. No.: WO2009/143643
PCT Pub. Date: Dec. 3, 2009

(65) Prior Publication Data

US 2011/0075368 A1 Mar. 31, 2011

(30) Foreign Application Priority Data

May 27, 2008 (CH) ........................................ 796/08
May 7, 2009 (CH) ........................................ 714/09

(51) Int. Cl.
*H05K 7/20* (2006.01)
*H01F 27/08* (2006.01)

(52) U.S. Cl.
USPC ................................ 361/699; 336/60; 336/61

(58) Field of Classification Search
USPC ...................................................... 336/60–61
See application file for complete search history.

(56) References Cited

U.S. PATENT DOCUMENTS

| | | | | |
|---|---|---|---|---|
| 1,471,096 | A | 10/1923 | Brand | |
| 2,819,431 | A * | 1/1958 | Maxwell | 335/219 |
| 3,501,272 | A * | 3/1970 | Benak | 423/461 |
| 4,485,289 | A | 11/1984 | Schwartz | |
| 4,593,261 | A | 6/1986 | Forster et al. | |
| 4,956,626 | A | 9/1990 | Hoppe et al. | |
| 4,960,967 | A | 10/1990 | Buffenoir et al. | |
| 5,097,241 | A | 3/1992 | Smith et al. | |
| 5,954,988 | A * | 9/1999 | Lee | 219/757 |
| 6,163,241 | A | 12/2000 | Stupak, Jr. et al. | |
| 6,259,347 | B1 * | 7/2001 | Sines | 336/219 |
| 7,129,808 | B2 * | 10/2006 | Roebke et al. | 336/55 |
| 7,227,754 | B2 | 6/2007 | Griesinger et al. | |
| 7,896,804 | B2 * | 3/2011 | Uchimura et al. | 600/173 |
| 2005/0243502 | A1 | 11/2005 | Griesinger et al. | |

FOREIGN PATENT DOCUMENTS

| | | |
|---|---|---|
| DE | 1 057 219 B | 5/1959 |
| EP | 0 680 055 A1 | 11/1995 |
| EP | 1 592 028 A2 | 11/2005 |

OTHER PUBLICATIONS

International Search Report (PCT/ISA/210) dated Sep. 7, 2009.
Notification of Transmittal of Translation of the International Preliminary Report on Patentability (Forms PCT/IB/338 and PCT/IB/373) and the Written Opinion of the International Searching Authority (Forms PCT/ISA/237) issued in corresponding International Application No. PCT/CH2009/000173 dated Dec. 16, 2010.

* cited by examiner

*Primary Examiner* — Gregory Thompson
(74) *Attorney, Agent, or Firm* — Buchanan Ingersoll & Rooney PC

(57) ABSTRACT

A liquid-cooled electromagnetic component (reactor, transformer) including a plurality of disc-shaped coils with one or more turns and a flat radiator located between them, wherein at least two disc coils are assigned to a flat radiator, and in which all the turns (turns of the coil) are in direct thermal contact with a surface of the flat radiator. This component is used in power converter installations and in midfrequency installations.

15 Claims, 5 Drawing Sheets

WATER-COOLED REACTOR

The disclosure relates to an electromagnetic component (reactor, transformer).

In power converter-supplied installations, for smoothing and filtering purposes, reactors that produce high losses, that are difficult to cool, and that have comparatively high weights and volumes must often be heavily used. This is especially unpleasant when these components are to be installed in cabinets.

In the lower industrial power range up to roughly 1 MW of installation power, inductive power components are often naturally cooled, i.e., with ambient air, for cost reasons, moreover usually with forced air circulation. Here, air, for example, is forced through special air channels that are recessed in the winding. These measures increase the reactor weight and volume, and unfavorably also the copper demand. A good specific cooling action can, moreover, be achieved only by raising the winding temperature; this is very disruptive for the surrounding area of the installation.

Inductive components for medium-frequency operation, for example transformers for inductive heating installations that operate in the kHz range, produce high losses that essentially can only be dissipated by means of water cooling. Here, the prior art is to form the winding from tubes or special hollow conductors, a cooling liquid flowing through these tubes. Since this cooling liquid has the electrical potential of the surrounding conductor, it must be insulating; for example when using water, the water must be deionized. The structure and cooling are complex in direct conductor cooling and are therefore hardly ever used in conventional industrial installations.

According to patent document DE 10 57 219, a medium- and high-frequency transformer is known that has divided or undivided disk windings, the primary and secondary disk coils layered on top of one another being present in alternation. The disk windings are only partially cooled directly with water, oil or a gaseous coolant, while the heat loss in the other parts is dissipated by heat conduction to the directly cooled parts. The secondary winding has a cooling channel in which the coolant flows. One disadvantage of this arrangement is that the coolant is in direct contact with the Cu winding; this is undesirable and should be avoided.

The object of the invention is to propose a design and a technology for magnetic components and their cooling with which the following is achieved:

- Considerable reduction of weight and volume by at least a factor of two;
- Especially a reduction of the specific proportion of copper for the winding;
- Free choice of the coolant, especially the possibility of service water cooling;
- Operation of the windings at surface temperatures up to 100° C., as a result of which the components are suitable for cabinet installation.

Another object of the invention is to devise a method for producing the components.

The invention is presented in more detail below based on the figures. Here:

The invention relates to a design and a technology for electromagnetic components (reactors, transformers) that consist of one or more disk-shaped coils with directly adjoining, electrically insulated, plate-shaped cooling elements through which a cooling medium flows.

Figure 1:
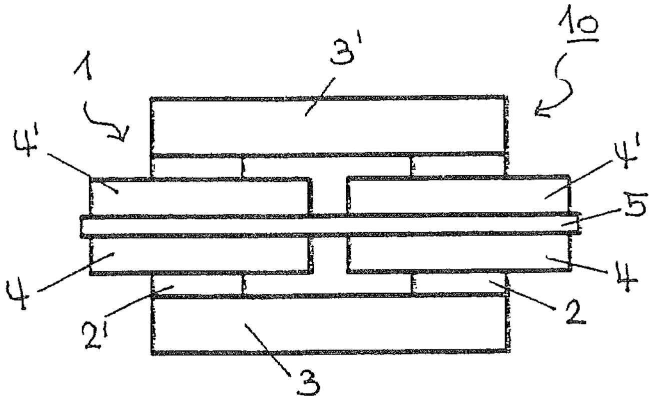
FIG. 1 shows a schematic of a simple, single-phase reactor

FIG. 1 shows the schematic of a simple, single-phase reactor. This reactor 10 consists of a core lamination package 1 with two legs 2, 2' and two yokes 3, 3'. The legs, for example, each bear two coils 4, 4' that are made as single-layer disk coils; in between, directly adjoining there is a specially designed, bilaterally acting flat radiator 5. The single-layer disk coil has the effect that each individual turn of the winding is directly connected to a cooling surface. A double-sided radiator can thus always cool two disk coils per leg; this has proven especially advantageous.

Figure 1B:
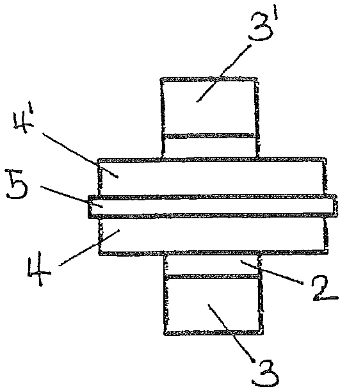
FIG. 1B shows a top view relative to FIG. 1
Figure 1A:
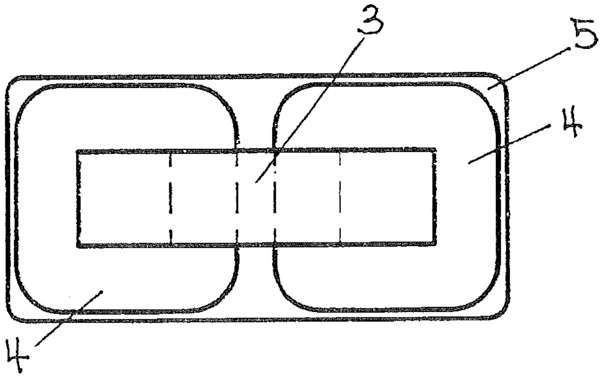
FIG. 1A shows a side view relative to FIG. 1

FIGS. 1A and 1B show the side view and the top view relative to FIG. 1. The yokes 3, 3', the coils 4, 4', the flat radiator 5, and the leg 2 can be seen in FIG. 1B.

The flat radiator 5 must be made insulating. For this purpose, a radiator in solid plastic technology can be used, the cooling medium or the cooling liquid being completely surrounded by plastic and the adjoining turns being electrically insulated. It is also possible to use a metal radiator that is provided with an insulating layer. The flat radiator 5 can be designed as a multi-layer metal construction with an inner cooling structure and outer plastic insulation, this plastic layer completely surrounding the radiator. Especially well-suited metals are aluminum and steel as well as their alloys. It has been shown, surprisingly enough, that the use of stainless, nonmagnetic steel is especially advantageous since in this way, harmful and unwanted eddy current losses are reduced by a factor greater than 4 in comparison with aluminum.

To improve heat transfer between the coil disk (disk coil) and the bordering surface of the flat radiator, a thermally conductive plastic film of slight hardness and resilient or yielding properties that is a few tenths mm thick is used. So that the transport of heat can be maximized, the thermal contact surfaces must make contact plane-parallel and with sufficient pressure. The participating electrical conductor and radiator insulations must have thermal conductivity that is as high as possible with simultaneous electrical strength. These requirements can only be satisfied by careful selection of modern materials, such as, for example, by ceramic filled polymers or plastics in general.

The structure of flat radiators and disk coils generally has air gaps, in which specially designed air gap inserts are located.

The coil can also be cemented in an elastic and heat-conducting manner to the radiator surface.

To improve the transport of heat from the cooling liquid to the cooling surface, the radiator is structured inside to enlarge the inner surface.

The number of flat radiator units in one component must be kept as low as possible for reasons of cost. In the example according to FIG. 1, this is achieved by a horizontally continuous flat radiator cooling the coils of the two legs. Thus, a radiator cools a total of four coils, in a 3-phase arrangement with three legs even six coils. Thus, external connections and thus additional connection material for the cooling medium are eliminated since these connections are located within the flat radiator.

Figure 2:
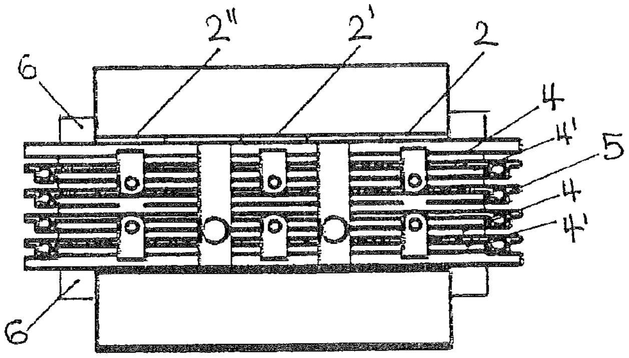
FIG. 2 shows a water-cooled filter reactor that is designed in three phases for a power converter installation

Embodiment:

FIG. 2 shows a water-cooled filter-reactor for a power converter installation. Based on a water-cooled filter-reactor that is designed in three phases for a power converter installation in the 2 MW power range, one configuration of the reactor according to the invention with a total of 24 component coils that are located on eight planes is described.

The reactor has an iron core with three wound legs 2, 2', 2". Each leg in this example has eight single-layer flat coils 4, 4' (disks). There is one flat radiator 5 between two coil disks of each leg at a time, which disks sit on the same installation plane. This flat radiator is thus 3-part and cools a total of eight coils. Altogether in this arrangement, four flat radiators are required, according to the invention each individual turn of the entire winding of the reactor being in direct contact with one radiator surface and thus able to be optimally cooled. The entire stack structure is held together by way of a pressing device 6 that maintains the contact pressure between the coil disks and the surfaces of the flat radiator.

Figure 2A:
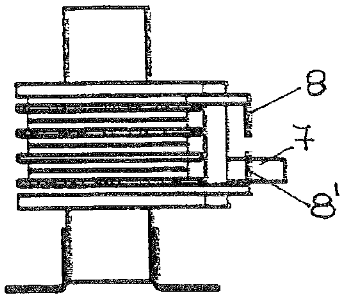
FIG. 2A shows a side view relative to FIG. 2
Figure 2B:
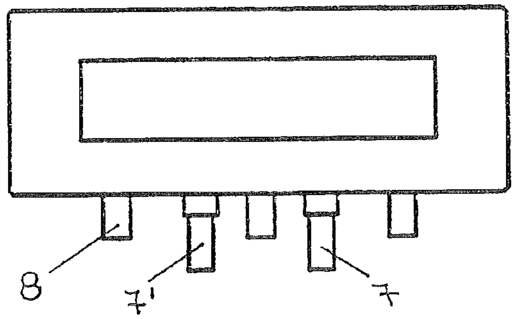
FIG. 2B shows a top view relative to FIG. 2

In this example, all coil disks that belong to one leg are connected electrically in series and therefore the same electrical current flows through them. Alternatively, the coil disks are connected in parallel. The cooling liquid is conversely routed into and out of all four flat radiators via a water distributor in parallel to improve the cooling action and to keep the pressure drop low. FIGS. 2A and 2B show the side view and the top view relative to FIG. 2. The inlet and outlet nozzles 7, 7' of the cooling medium and the electrical terminals 8, 8' for the first package of turns of the three phases can be seen.

Figure 3:
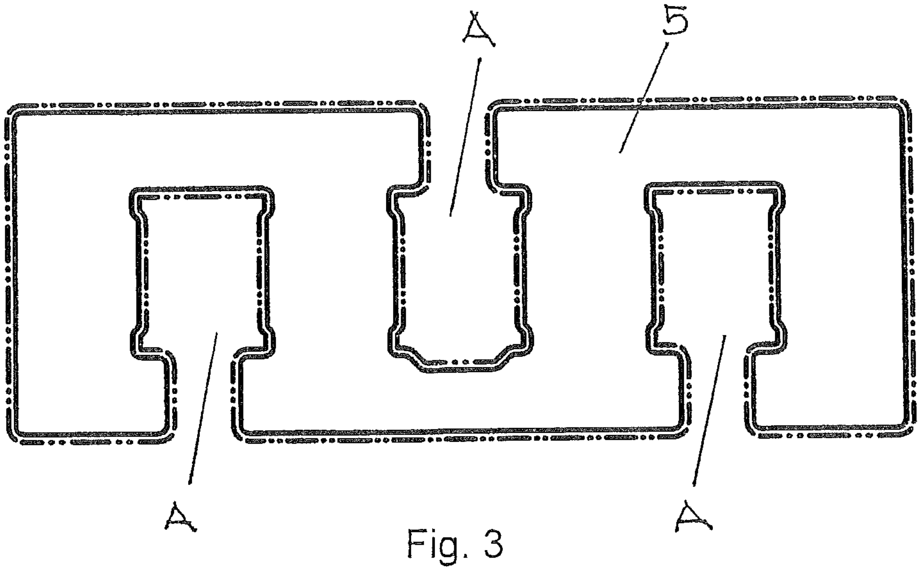
FIG. 3 shows the geometry of the flat radiator

FIG. 3 shows the geometry of the flat radiator. It has an S-shape and thus has three recesses A that ensure that the radiator does not work as a short-circuit turn as a result of transformer coupling. In these recesses, moreover, the series connections run between the coil disks respectively over and under the flat radiator 5.

The flat radiators consist of several aluminum or steel plates that are welded together and that collectively have a thickness of less than 8 mm. The middle, water-carrying plates in this layer structure are structured by means of nubs to increase the heat transfer surface.

For reasons of insulation technology, the radiator plates are blanketed, i.e., over the entire surface, with an insulator layer of a few tenths mm. The insulating material used has high insulation resistance with sufficient thermal conductivity and mechanical compressive strength. To make the support pressure of the coils on the cooling surfaces uniform, the latter are covered with a special, relatively soft, heat-conducting plastic film that likewise has a thickness of a few tenths mm.

Figure 3A:
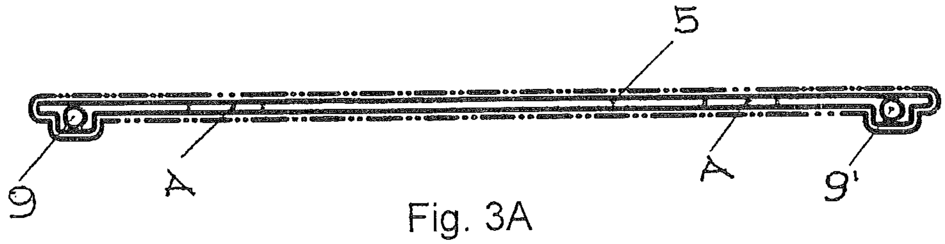
FIG. 3A shows a side view relative to FIG. 3
Figure 3B:
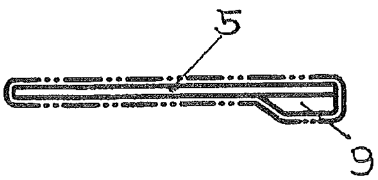
FIG. 3B shows a top view relative to FIG. 3

FIGS. 3A and 3B show the side view and the top view relative to FIG. 3. The inlet and outlet nozzles 9, 9' of the cooling medium of the flat radiator 5 and the recesses A can be seen.

The aforementioned eight coils of one leg can be wound as individual coils and would then all have to be connected individually—in the example in series. In the indicated reactor, these disruptive series connections were avoided by a special winding technique. Here, the coils lying on top of one another in the stack are partially wound in an opposite manner, by which every other series connection is displaced into the coil interior. As a result, this makes it possible to place the series connections exactly in the aforementioned recesses of the flat radiator.

A flat radiator 5 can carry several coils 4, 4' of a winding arrangement, for example two coils of each phase of a multiphase arrangement at a time, the flat radiator being configured by the shaping and the material selection such that it has eddy current losses that are as low as possible.

Advantageously, a filled plastic is suitable as flat radiator insulation, for which a thermally conductive, insulating metal oxide such as, for example, aluminum oxide or a carbide between 20-50% is added to the plastic.

To improve heat transfer between the coil disk (disk coil) and bordering surface of the flat radiator, a thermally conductive plastic film that is 0.1-0.4 mm thick can be used, or cementing with a thermal conductive cement can be used.

Figure 4:
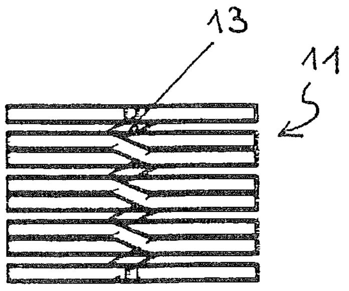
FIG. 4 shows a package of turns with 8 disk coils
Figure 4A:
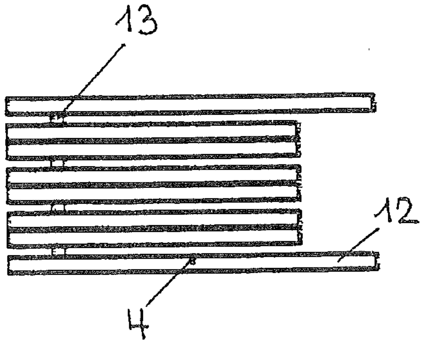
FIG. 4A shows a side view relative to FIG. 4
Figure 4B:
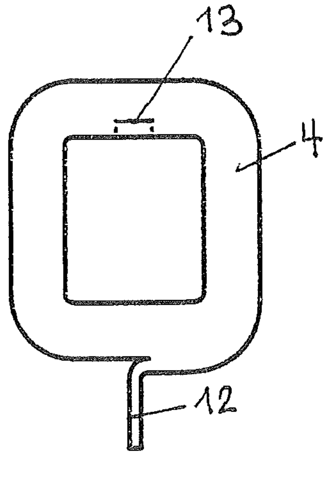
FIG. 4B shows a top view relative to FIG. 4

FIG. 4 shows the turn package 11 with eight disk coils. FIGS. 4A and 4B show the corresponding side view or top view. In FIG. 4A, the individual disk coil 4 with its terminal 12 leading to the outside is shown. The inner terminal 13 leads to the next adjacent disk coil.

The disk coils 4, 4' of one phase or one structure stack are wound such that outer connections that are located in the region of the flat radiator are avoided and such that the inner series connections 13 fit into the recesses of the assigned radiator plate that are intended for this purpose.

The indicated reactor as a result of the cooling measures taken shows both a weight reduction and also a volume reduction by roughly a factor of 2.5 compared to a forced air-cooled reactor of the same design rating and conventional design with a tubular layer winding.

It is fundamentally possible to also use the cooling arrangement according to the invention for other electromagnetic components, such as, for example, in nonferrous reactors and transformers in general and in medium-frequency transformers in particular.

Figure 5:
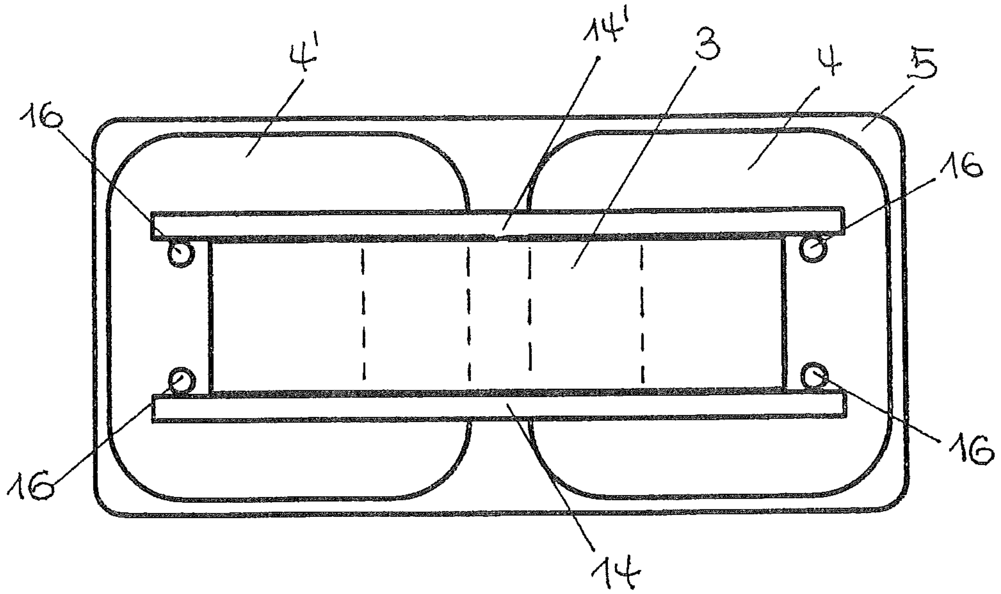
FIG. 5 shows a side view of a component according to the invention with a water-cooled iron core.

FIG. 5 shows the side view of a component according to the invention with a water-cooled iron core. In turn, the yoke 3 consisting of an iron core, the disk coils 4, 4', and the flat radiator 5 can be seen. On both sides of the yoke 3, two metal plates 14, 14', preferably aluminum plates, are mounted, and each has tubes 16, preferably aluminum tubes, welded on, on the end side. The tubes 16 likewise now route the cooling medium, by which the iron core is additionally efficiently cooled. Advantageously, but not necessarily, it is the same cooling medium as for the disk coils. Advantageously, but not necessarily, the cooling medium is routed first through the disk coils and afterwards through the tubes 16. This combination of cooling of the copper and of the iron with a single cooling medium yields a quite efficient cooling circuit and quite efficient cooling of the components.

A method for producing the component is characterized in that the flat radiator 5 is cemented to the disk coil 4 to conduct heat. In this way, the flat radiator and the disk coil form a modular unit.

These components are used in water-cooled power converter installations and in medium-frequency installations, especially for inductive heating.

The invention claimed is:

1. Liquid-cooled electromagnetic component comprising at least two disk-shaped coils with one or more turns and a flat radiator located in between, wherein the at least two disk-shaped coils are assigned to the flat radiator, each disk-shaped coil having turns, of which each is located in direct thermal contact with surfaces of the flat radiator by way of a heat-conducting insulating layer for isolating a cooling medium and wherein the at least two disk-shaped coils are wound such that outer connections located in a region of the flat radiator are avoided and inner series connections between the at least two disk-shaped coils fit into a recess of an assigned radiator plate of the flat radiator.

2. Component according to claim 1, wherein a plastic arrangement is selected as the flat radiator such that a liquid-carrying layer is completely surrounded by plastic.

3. Component according to claim 1, wherein a multilayer metal construction with an inner cooling structure and outer plastic insulation is used as the flat radiator, whereby a plastic layer completely encloses the flat radiator.

4. Component according to claim 3, wherein the metal construction is formed of a metal selected from a group which consists of aluminium, stainless steel, and alloys thereof.

5. Component according to claim 3, wherein the metal construction consists of stainless, nonmagnetic steel.

6. Component according to claim 5, wherein for the metal construction of stainless, nonmagnetic steel, eddy current losses compared to aluminium are smaller by more than a factor of 4.

7. Component according to claim 2, wherein the plastic arrangement contains a filler that improves a thermal conductance value.

8. Component according to claim 1, wherein to improve heat transfer between the at least two disk-shaped coils and a bordering surface of the flat radiator, a thermally conductive plastic film of slight hardness and resilient or yielding properties that is a few tenths mm thick is used.

9. Component according to claim 1, wherein the at least two disk-shaped coils are forced into closed contact with the surfaces of the flat radiator by a mechanical pressing arrangement.

10. Component according to claim 1, wherein the at least two disk-shaped coils are cemented directly to the flat radiator surface to conduct heat.

11. Component according to claim 1, wherein the flat radiator being configured by shaping and material selection such that it has eddy current losses that are as low as possible.

12. Component according to claim 1, wherein a yoke is surrounded by metal plates, which have metal tubes welded on an end side, and wherein a same or a different cooling medium is routed through the metal tubes, for efficient cooling of copper and iron.

13. Component according to claim 12, comprising a cooling medium which first passes through the flat radiator and only afterwards passes through the metal tubes.

14. Component according to claim 1, wherein both a weight reduction and also a volume reduction of the component by a factor of 2 is achieved compared to a forced air-cooled component in comparable design and use.

15. Method for producing a liquid-cooled electromagnetic component having at least two disk-shaped coils with one or more turns and a flat radiator located in between, wherein the at least two disk-shaped coils are assigned to the flat radiator, each disk-shaped coil having turns, of which each is located in direct thermal contact with surfaces of the flat radiator by way of a heat-conducting insulating layer for isolating a cooling medium, the method comprising:

winding the at least two disk-shaped coils such that outer connections located in a region of the flat radiator are avoided and inner series connections between the at least two disk-shaped coils fit into a recess of an assigned radiator plate of the flat radiator;

cementing the flat radiator to the disk-shaped coil to conduct heat; and forming a modular unit.

* * * * *